(12) United States Patent
Chialastri (10) Patent No.: US 10,520,259 B2
(45) Date of Patent: Dec. 31, 2019

(54) MEMORY MODULE COOLER WITH ROTATABLE COOLING TUBE

(71) Applicant: HEWLETT PACKARD ENTERPRISE DEVELOPMENT LP, Houston, TX (US)

(72) Inventor: David Scott Chialastri, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 120 days.

(21) Appl. No.: 15/679,517

(22) Filed: Aug. 17, 2017

(65) Prior Publication Data
US 2019/0056179 A1    Feb. 21, 2019

(51) Int. Cl.
| | |
|---|---|
| F28D 15/02 | (2006.01) |
| H01L 23/427 | (2006.01) |
| H01L 23/473 | (2006.01) |
| G06F 1/20 | (2006.01) |
| H05K 7/20 | (2006.01) |
| F28F 9/06 | (2006.01) |
| F28D 1/053 | (2006.01) |
| F28D 15/04 | (2006.01) |
| F28F 9/02 | (2006.01) |
| F28F 9/10 | (2006.01) |
| F28D 21/00 | (2006.01) |

(52) U.S. Cl.
CPC ..... *F28D 15/0208* (2013.01); *F28D 1/05366* (2013.01); *F28F 9/06* (2013.01); *G06F 1/20* (2013.01); *H01L 23/427* (2013.01); *H05K 7/20254* (2013.01); *F28D 15/043* (2013.01); *F28D 2021/0029* (2013.01); *F28F 9/0229* (2013.01); *F28F 9/10* (2013.01); *F28F 2280/10* (2013.01); *H01L 23/473* (2013.01)

(58) Field of Classification Search
CPC .............. F28D 15/0208; F28D 15/043; F28D 1/05366; F28D 2021/0029; F28F 9/06; F28F 9/0229; F28F 9/10; G06F 1/20; G06F 1/203; H01L 23/427; H01L 23/473; H05K 7/20254
USPC ........................................................ 62/259.2
See application file for complete search history.

(56) References Cited

U.S. PATENT DOCUMENTS

| | | |
|---|---|---|
| 7,061,760 B2 | 6/2006 | Hornung et al. |
| 8,570,744 B2 | 10/2013 | Rau et al. |

(Continued)

OTHER PUBLICATIONS

Celanese Corporation, "CoolPoly® D-Series," 2017, pp. 1-2 [online], Retrieved from the Internet on Aug. 17, 2017 at URL: <https://www.celanese.com/engineered-materials/products/CoolPoly-TCP/coolpoly-d-series.aspx>.

(Continued)

*Primary Examiner* — Joel M Attey
(74) *Attorney, Agent, or Firm* — Hewlett Packard Enterprise Patent Department (57) ABSTRACT

An example memory module cooler may include a first liquid manifold, a second liquid manifold, and a cooling tube connected to the first and second liquid manifolds such that. The cooling tube may be connected to the manifolds such that (1) liquid coolant can flow from the first liquid manifold through the cooling tube to the second liquid manifold, and (2) the cooling tube can be rotated relative to the first and second liquid manifolds around a longitudinal axis of the cooling tube. The cooling tube may have an oblong cross-sectional profile.

17 Claims, 8 Drawing Sheets

(56) References Cited

U.S. PATENT DOCUMENTS

| | | |
|---|---|---|
| 8,587,943 B2 | 11/2013 | Barina et al. |
| 8,638,559 B2 | 1/2014 | Barina et al. |
| 8,659,897 B2 | 2/2014 | Meijer et al. |
| 8,787,021 B2 | 7/2014 | Murakami et al. |
| 9,158,348 B2 | 10/2015 | Berk et al. |
| 9,245,820 B2 | 1/2016 | Goldrian et al. |
| 9,513,064 B2 * | 12/2016 | Cox .................... H01L 23/367 |
| 2006/0250772 A1 | 11/2006 | Salmonson et al. |
| 2010/0091447 A1 * | 4/2010 | Jaggers .................... G06F 1/20 |
| | | 361/679.47 |

OTHER PUBLICATIONS

Ensinger, "Thermally Conducting Compounds. More than just one option: TECACOMP TC," 2017, pp. 1-3 [online], Retrieved from the Internet on Aug. 17, 2017 at URL: <https://www.ensingerplastics.com/en/compounds/portfolio/thermally-conductive>.

\* cited by examiner

MEMORY MODULE COOLER WITH ROTATABLE COOLING TUBE

BACKGROUND

Computing devices may include memory modules. When in use, the memory modules may generate excessive heat, which may adversely affect the memory modules and/or other components of the computing device. A memory module cooler may be used to cool the memory modules.

DETAILED DESCRIPTION

1—Example Memory Module Coolers: Overview

Example memory module coolers disclosed herein may be liquid cooling devices that use liquid coolant to remove heat from memory modules and transfer the heat to a desired location (such as outside of the computing device). In particular, the example memory module coolers disclosed herein may include two liquid manifolds (sometimes referred to as just "manifolds") (e.g., manifolds 110, 120) and a number of cooling tubes (e.g., cooling tubes 130) connecting the manifolds together such that liquid coolant can flow between the two manifolds via the cooling tubes (see, for example, FIG. 1). When the example memory module cooler is installed in a computing device, the two manifolds may be arranged on opposite sides of the memory modules (e.g., memory modules 200) such that the cooling tubes are in contact with the memory modules while extending roughly in parallel therewith (see, for example, FIG. 8). When installed, the liquid manifolds may be connected into a liquid cooling system such that liquid coolant flows through the memory module cooler (e.g., liquid coolant enters the first manifold via an inflow tube, passes through the cooling tubes into the second manifold, and exits the second manifold via an outflow tube) (see, for example, FIG. 8).

In some example memory module coolers disclosed herein, the cooling tubes may have oblong cross-sectional profiles and may each be rotably connected to the manifolds. Specifically, the cooling tubes may be connected to the manifolds in such a manner that each cooling tube can be rotated relative to the first and second liquid manifolds around a longitudinal axis of the cooling tube. Because the cooling tubes have oblong cross-sectional profiles in such examples, the horizontal offset between the cooling tubes (i.e., the minimum distance between adjacent cooling tubes in a top-down plan view) may be changed by rotating the cooling tubes. For example, the horizontal offset between the cooling tubes may be at a maximum when the cooling tubes are vertically oriented (e.g., their respective major axes are vertical), and the horizontal offset between the cooling tubes may be decreased as the cooling tubes are rotated away from being vertically oriented (e.g., as their respective major axes are rotated away from vertical). Thus, when the memory module cooler is installed in a computing device, the distance between one of the cooling tubes and an adjacent one of the memory modules may be changed by rotating the cooling tube. In particular, in certain examples, when the memory module cooler is installed in a computing device, the cooling tubes may be rotated between a first configuration in which the cooling tubes have wide horizontal offsets (and hence are generally not in contact with any of the memory modules) (see, for example, FIG. 2A) and a second configuration in which each cooling tube is in contact with one or two of the memory modules (see, for example, FIG. 2B). In some of these examples, the cooling tubes may be made from a semi-rigid material, such that continuing to rotate the cooling tubes after they initially contact the memory modules may slightly deform the cooling tubes, thereby increasing a contact area and improving heat conduction (see, for example, FIG. 2C).

1.1—Example Benefits of Example Memory Module Coolers

The example memory module coolers disclosed herein may provide effective cooling for the memory modules, while providing additional benefits that may not be possible with other approaches to cooling the memory modules.

For example, memory module coolers disclosed herein may be compatible with many different memory module form factors. In particular, different types of memory modules may have different thicknesses. However, because in certain examples disclosed herein the cooling tubes have oblong cross-sectional profiles and are rotatable, the cooling tubes may be able to make good thermal contact with the memory modules regardless of their thickness (see FIGS. 2B and 2D, which are described in greater detail below). This may allow a single memory module cooler to service multiple memory module form factors, which may allow greater flexibility to a manufacturer of a computing device in sourcing memory modules. In addition, this may allow memory modules to be replaced post-manufacture of the computing device with different thickness memory modules, without the memory module cooler needing to also be replaced to accommodate the new memory modules.

In contrast, in some alternative approaches the portions of a memory module cooler that are to draw heat out of the memory modules may be designed for a specific memory module form factor, and may not fit a different memory module form factor. For example, in one alternative approach a metallic heat sink or "jacket" may be designed such that memory modules of a specific thickness fit tightly into slots in the heat sink so as to maximize an area of contact, but in such an approach memory modules that are thicker cannot fit in the slots and memory modules that are thinner do not make good contact with the heat sink. As another example, in another alternative approach cooling elements such as heat pipes extend between memory modules, but in such an approach the cooling elements cannot fit between thicker memory modules and the cooling elements do not make contact with thinner memory modules. Thus, in the alternative approaches a different memory module cooler may need to be designed for different memory module thicknesses, and replacement of memory modules may be impossible without also replacing the memory module cooler. In some of the alternative approaches, memory modules that are thinner than what the memory module cooler is designed for may be accommodated by adding a gap filler between the memory module and the cooling element; however, this may increase the difficulty of installing, servicing, and/or uninstalling the memory module cooler and/or memory modules, and may also reduce heat conduction from the memory modules into the memory module cooler.

As another example benefit, memory module coolers disclosed herein may allow good heat conduction to be obtained between the cooling tubes and the memory modules without needing thermal interface materials (such as thermal grease, thermal gap filler, thermal pads, etc.) to be disposed between the cooling tubes and the memory modules. For example, in example memory module coolers disclosed herein the cooling tubes may be rotated so as to tightly contact the memory modules (see FIG. 2B), which may allow for good heat conduction without needing a gap filler. As another example, in example memory module coolers in which the cooling tubes are semi-rigid, pressure from the memory modules may cause the cooling tubes to deform slightly if the cooling tubes continue to be rotated past an initial contact point with the memory modules (see FIG. 2C), and this deformation may increase the contact area between the cooling tubes and the memory modules, thereby even further improving heat conduction. Because thermal interface materials are not always needed with example memory module coolers disclosed herein, the cost and difficulty of installing, servicing, and/or uninstalling the memory module cooler and/or memory modules may be decreased.

In contrast, in some alternative approaches thermal interface material may be required in order to obtain satisfactory heat conduction. For example, in alternative approaches in which metallic cooling elements such as heat pipes extend between memory modules, it may be difficult to obtain consistent contact between the cooling elements and the memory modules and the total area of contact may also be small, thus resulting in poor heat conduction if thermal interface materials are not used. As another example, in alternative approaches in which the memory modules are thinner than a thickness for which the memory module cooler is designed, there may be no contact at all between the memory modules and cooling elements without some sort of gap filler.

As another example benefit, the example memory module coolers disclosed herein may allow a person to physically access the memory modules (e.g., inspect, service, remove, install, etc.) without requiring the memory module cooler to be uninstalled (partially or fully) prior to the access and then reinstalled after the access. In particular, example memory module coolers disclosed herein do not block (partially or fully) any of the memory modules (or memory sockets) from above. Furthermore, the cooling tubes may easily be caused to release the memory modules by rotating the cooling tubes towards the first configuration. Thus, memory modules may be easily removed without uninstalling/reinstalling the memory module cooler by releasing the memory modules and then pulling the memory modules out of their memory sockets. Similarly, new or replacement memory modules may be easily installed without uninstalling/reinstalling the memory module cooler by inserting the memory modules into their memory sockets while the cooling tubes are in the first configuration, and then rotating the memory tubes until they contact the memory modules. Furthermore, in some example memory module coolers disclosed herein, thermal interface material is not used between the cooling tubes and the memory modules, and therefore thermal interface material does not need to be removed and/or reinstalled when memory modules are accessed.

In contrast, some alternative approaches may require a memory module cooler to be uninstalled to allow the memory modules to be accessed. For example, in some alternative approaches a metallic heat sink may cover, fully or partially, the top and/or sides of one or more of the memory modules, thus preventing access to the memory modules without the heat sink being removed. As another example, in some alternative approaches, thermal interface materials may need to be disposed between the memory modules and the memory module cooler, and in such examples even if the memory module cooler does not physically block access to the memory modules, accessing the memory modules may require removing and/or reinstalling the thermal interface material. Uninstalling and then reinstalling a memory module cooler and/or thermal interface material may take a substantial amount of time, and may be prone to user errors that may result in reducing cooling efficiency (e.g., forgotten or poorly applied thermal interface material), damage to the cooler, and/or damage to other components of the computing device (e.g., from liquid coolant spills, etc.). These difficulties are even more likely if the person attempting to access the memory is not familiar with the memory module cooler and/or liquid cooling systems in general.

2—Example Memory Module Coolers: Details

An example memory module cooler 100 (hereinafter, "cooler 100") will be described below with reference to FIGS. 1-6.

Figure 1:
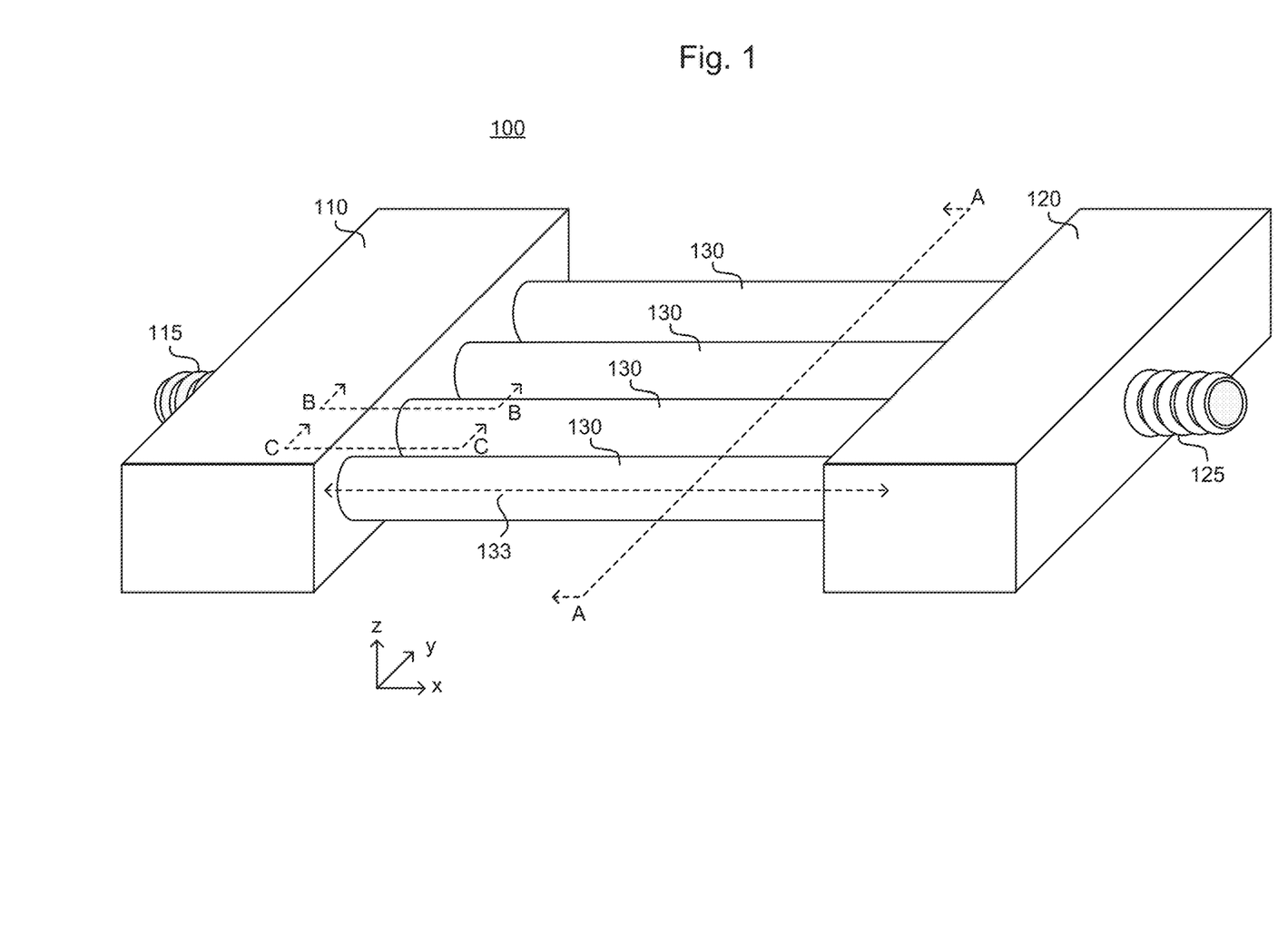
FIG. 1 illustrates a perspective view of an example memory module cooler.

FIG. 1 illustrates an example memory module cooler 100 (hereinafter, "cooler 100"). As noted above, the cooler 100 disclosed herein may be a liquid cooling device that uses liquid coolant to remove heat from memory modules. As illustrated in FIG. 1, the cooler 100 includes a first liquid manifold 110 (hereinafter "first manifold 110" or "manifold 110"), a second liquid manifold 120 (hereinafter "second manifold 120" or "manifold 120"), and a number of cooling tubes 130 that connect the first and second manifolds 110, 120.

Figure 3A:
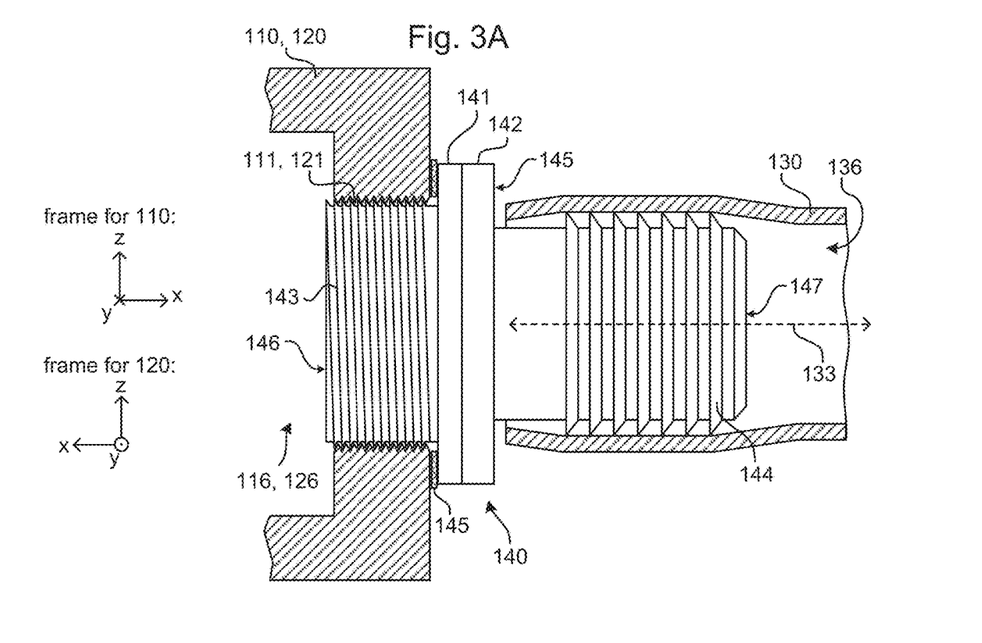
FIG. 3A illustrates a combination of an elevation view and a cross-sectional view of a portion of an example memory module cooler, showing an example connector that connects an example cooling tube to an example liquid manifold. In the Figure, the example connector is shown in elevation view and is not cut by the cross-section, while the example manifold and the example cooling tube are cut by the cross-section. Cut portions are indicated by hashing. The cross-section is taken along the line B-B in FIG. 1, which is approximately aligned with the longitudinal axis of one of the cooling tubes. The elevation view is taken from a perspective on the line C-C.

The first manifold 110 may include an interior chamber 116 that has an opening 111 for each cooling tube 130 (see, e.g., FIG. 3A). Similarly, the second manifold 120 may include an interior chamber 126 that has an opening 121 for each cooling tube 130 (see, e.g., FIG. 3A). The first and second manifolds 110, 120 may also include an inlet connector 115 and an outlet connector 125, respectively (see FIG. 1), for connecting the cooler 100 into a liquid cooling system, and the chambers 116, 126 may include openings corresponding to the inlet and outlet connectors 115, 125.

Each of the cooling tubes 130 may have a hollow portion 136 extending the length of the cooling tube 130 around the longitudinal axis 133 thereof (see, e.g., FIG. 3A). Each of the cooling tubes 130 may be physically connected to both the first and second manifolds 110, 120 so as to communicably connect the hollow interior 136 of the cooling tube 130 to respective interior portions of the chambers 116, 126 (see, e.g., FIG. 3A). For example, connectors 140 may be attached to the first and second manifolds 110, 120 in the openings 111, 121, and the cooling tubes 130 may be attached to the connectors 140 (see, e.g., FIG. 3A).

The chambers 116, 126 may each be liquid tight except for the openings 111, 121 and the openings in the inlet and outlet connectors 115, 125. In addition, the cooling tubes 130 may be liquid tight except for openings at the ends thereof, and these openings may be connected to the first and second manifolds 110, 120 in a liquid tight manner (see, e.g., FIG. 3A). Thus, the cooler 100 may enclose an liquid-coolant-containing volume that is liquid tight (except for the inlet and outlet connectors 115, 125), with portions of the liquid-coolant-containing volume being within the chamber 116, portions of the liquid-coolant-containing volume being within each of the cooling tubes 130, and portions of the liquid-coolant-containing volume being within the chamber 126. When the cooler 100 is connected into a liquid coolant system, liquid coolant may flow from upstream of the liquid coolant system into the first manifold 110 via the inlet connector 115, from the first manifold 110 into each of the cooling tubes 130, from each of the cooling tubes 130 into the second manifold 120, and out of the second manifold 120 via the outlet connector 115.

Any number of cooling tubes 130 may be included in the example cooler 100. In a first set of examples, n+1 cooling tubes 130 may be included in the cooler 100, where "n" is the number of memory modules 200 that the cooler 100 is designed to cool, and each memory module 200 may be located between a pair of cooling tubes 130 (see, e.g., FIG. 2A). Thus, in the first set of examples the two outermost cooling tubes 130 may be adjacent to one memory module 200, while the rest of the cooling tubes 130 may each be adjacent to two memory modules 200. In a second set of examples (not illustrated), the cooler 100 may include n−1 cooling tubes 130, and each memory module 200 may be located between a pair of cooling tubes 130 except for the two outermost memory modules 200, which each may be adjacent to one cooling tube 130. Thus, in the second set of examples all of the cooling tubes 130 may be adjacent to two memory modules 200.

2.1—Example Cooling Tubes: Details

In the example cooler 100, the cooling tubes 130 have oblong cross-sectional profiles (see, e.g., FIGS. 2A-2D). As used herein, the "cross-sectional profile" of a cooling tube 130 is the profile of the cooling tube 130 (i.e., the shape of its outermost boundary) in a cross-section taken on a plane perpendicular to the longitudinal axis 133 of the cooling tube 130 (e.g., on a plane parallel to the z-y plane in FIGS. 1 to 2D). As used herein, "oblong" means a two dimensional shape that is longer along one dimension than it is along the other dimension. For example, an ellipse whose major axis is longer than its minor axis is oblong, while an ellipse whose major axis and minor axis are equal (i.e., a circle) is not oblong. In certain examples, the cooling tubes 130 may have elliptical cross-sectional profiles, and a ratio of their major axis 131 to their minor axis 132 may be at least 3:2.

In the example cooler 100, the cooling tubes 130 are rotably connected to both of the manifolds 110, 120. Specifically, the cooling tubes 130 are connected to the manifolds 110, 120 in such a manner that each cooling tube 130 can be rotated relative to the manifolds 110, 120 around a longitudinal axis 133 of the cooling tube (see, e.g., FIGS. 2A-3A). In particular, connectors 140 may be used to connect the cooling tube 130 to the manifolds 110, 120, and the connectors 140 may allow rotation of the cooling tubes 130 while also allowing fluid to communicate through the connector 140 (see, e.g., FIG. 3A). In certain examples, the cooling tubes 130 may have the same center-to-center spacing in the y-direction as the memory sockets of the type of computing device for which the cooler 100 is designed.

As noted above, because the cooling tubes 130 have oblong cross-sectional profiles and are rotatable, the horizontal offset D between the cooling tubes 130 (i.e., the minimum distance between adjacent cooling tubes 130 in a top-down plane view) may be changed by rotating the cooling tubes 130 (see FIGS. 2A-2D). Specifically, the horizontal offset D is at its maximum value δ when the cooling tubes 130 are vertically oriented (i.e., when the major axes 131 are vertical), where δ depends on the spacing between the longitudinal axes 133 of the cooling tubes 130 and the length of the minor axes 132 of the cooling tubes 130 (see FIG. 2A). The horizontal offset D decreases from its maximum value as |θ| increases, where θ is the degree to which the cooling tubes 130 have been rotated away from a vertical orientation; in other words, θ is the angle between the cooling tubes 130 respective major axes 131 and a vertical plane, such as the x-z plane (where the vertical plane is parallel to the memory modules 200 when the cooler 100 is installed). The minimum value of the horizontal offset D=ε occurs at either |θ|=90° if $\theta_{max} \leq 90°$, or at $|\theta|=\theta_{max}$ if $\theta_{max}<90$, where $\theta_{max}$ is the maximum angle to which the cooling tubes 130 may be rotated. The minimum value ε depends on $\theta_{max}$, the spacing between the longitudinal axes 133 of the cooling tubes 130, the length of the major axes 131, and (if $\theta_{max} \leq 90°$) the length of the minor axes 132. $\theta_{max}$ may depend on the nature of the mechanism used to rotate the cooling tubes—in particular, some rotation mechanisms may allow any arbitrary rotation of the cooling tubes 130, while other rotation mechanisms may allow rotation within a specific range of angles.

Figure 2A:
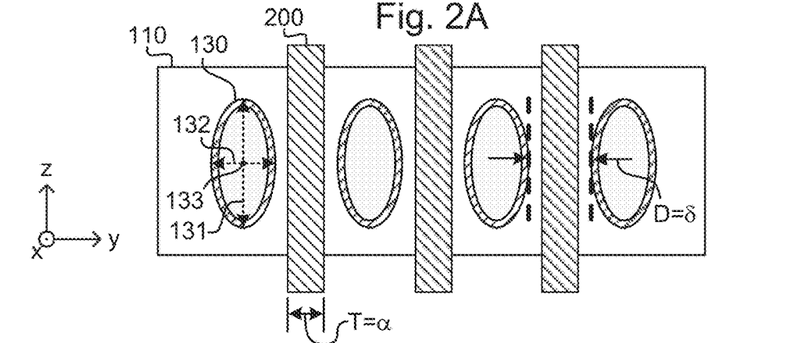
FIG. 2A illustrates a cross-sectional view of an example memory module cooler in which the cooling tubes are vertically oriented. The cross-section is taken along the line A-A in FIG. 1.
Figure 2B:
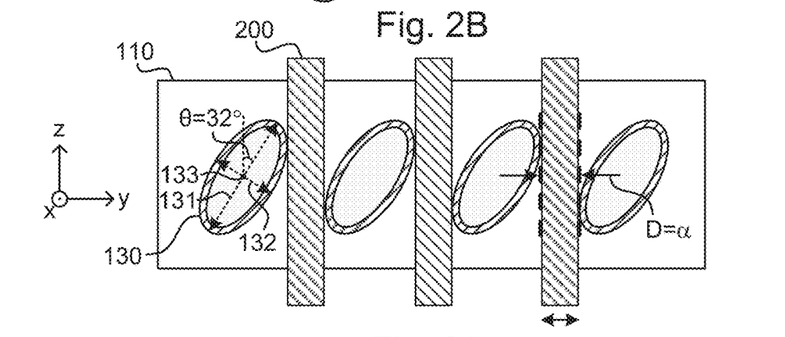
FIG. 2B illustrates a cross-sectional view of an example memory module cooler in which the cooling tubes are rotated until they contact adjacent memory modules. The cross-section is taken along the line A-A in FIG. 1.
Figure 2C:
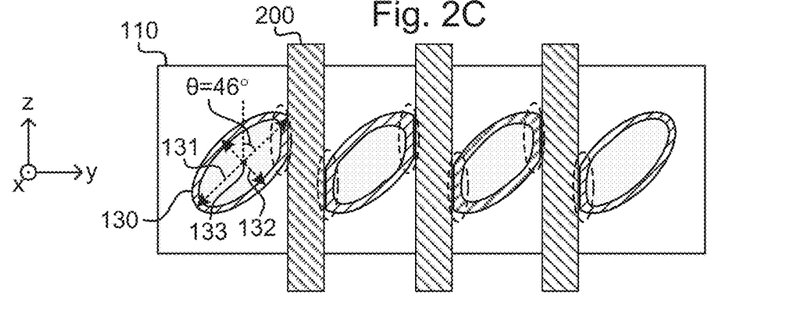
FIG. 2C illustrates a cross-sectional view of an example memory module cooler in which the cooling tubes are rotated beyond initial contact with memory modules thereby deforming the cooling tubes. The cross-section is taken along the line A-A in FIG. 1.
Figure 2D:
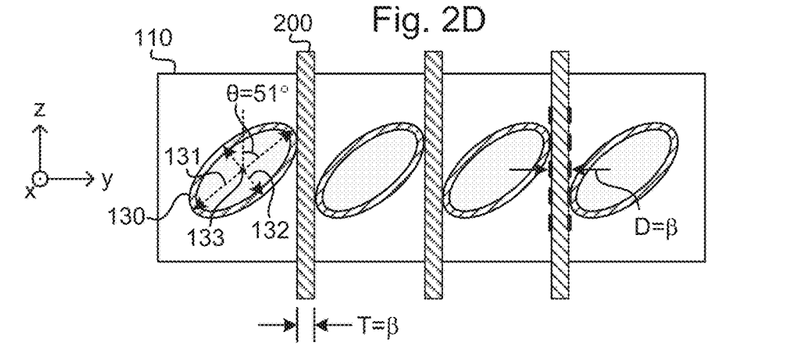
FIG. 2D illustrates a cross-sectional view of an example memory module cooler in which the cooling tubes are rotated until they contact adjacent memory modules, which are thinner than the memory modules in FIGS. 2A-2C. The cross-section is taken along the line A-A in FIG. 1.

For example, FIGS. 2A-2D illustrate the cooling tubes 130 at different degrees of rotation. In FIG. 2A, the cooling tubes 130 are vertically oriented, meaning their respective major axes 131 are approximately vertical, and in this configuration the horizontal offset D between cooling tubes 130 is at its maximum value D=δ. In FIG. 2B, the cooling tubes 130 have been rotated about their respective longitudinal axes 133 by an angle ↓=32°, and as a result the horizontal offset D between the cooling tubes 130 has been reduced to the value D=α, where α<δ. In FIG. 2D, the cooling tubes 130 have been even further rotated to the angle θ=51°, and as a result the horizontal offset D between the cooling tubes 130 has been reduced to the value D=β where β<α.

Thus, when the cooler 100 is installed in a computing device, the distance between one of the cooling tubes 130 and an adjacent one of the memory modules 200 may be changed by rotating the cooling tube 130. For example, as illustrated in FIG. 2A, when θ=0, the cooling tubes 130 do not contact the adjacent memory modules 200; however, as illustrated in FIG. 2B, upon sufficient rotation of the cooling tubes 130, they will eventually come into contact with one or both of their adjacent memory modules 200. The smallest angle θ at which all of the cooling tubes 130 are in contact with their adjacent memory module(s) 200 may be referred to as $\theta_{contact}$, and the specific value of $\theta_{contact}$ will depend on the thickness T of the memory modules, the spacing between the longitudinal axes 133 of the cooling tubes 130, and the lengths of the major and minor axes 131, 132. In the example of FIG. 2B, $\theta_{contact}=32°$, while in the example of FIG. 2D, $\theta_{contact}=51°$, but these are merely examples used for illustration.

In general, any configuration in which θ=0 or $0 \leq |\theta| < \theta_{contact}$ is an example of the "first configuration", while, in general, any configuration in which $\theta_{contact} \leq |\theta| < 90°$ may be an example of the "second configuration". See below for a more detailed definition of "first configuration" and "second configuration."

If the cooling tube 130 is centered in the y-direction between two adjacent memory modules 200, then when $\theta=\theta_{contact}$ the cooling tube 130 may contact both of the adjacent memory modules 200 simultaneously (see the middle two cooling tubes 130 in FIGS. 2B and 2D). If the cooling tube 130 is not between two memory modules 200 (see the leftmost and rightmost cooling tubes 130 in FIGS. 2B and 2D), then when $\theta=\theta_{contact}$ the cooling tube 130 may contact just the one adjacent memory module 200. If the cooling tube is between two memory modules 200 but is not centered in the y-direction between them (not illustrated), then when $\theta=\theta_{contact}$ the cooling tube 130 might contact just the closer of the two adjacent memory modules 200.

Because the distance between the cooling tubes 130 and the memory modules 200 may be changed by rotating the cooling tubes 130, the cooler 100 may be compatible with many different memory module form factors. In particular, the cooling tubes 130 may be able to make good thermal contact with the memory modules 200 regardless of their thickness T (within a certain range of thicknesses). More specifically, in examples in which the memory modules 200 are centered in the y-direction between the cooling tubes 130, the memory modules 200 may have any thickness T within the range ε<T≤δ. In examples in which the memory modules 200 are not centered in the y-direction between the cooling tubes 130, the modules 200 may have any thickness T that is less than or equal to 2·λ, where λ is the minimum distance between the memory module 200 and its closest adjacent cooling tube 300. For example, FIGS. 2B and 2D illustrate examples in which the same cooler 100 is able to cause the cooling tubes 130 to make contact with either memory modules 200 having a thickness of T=α (see FIG. 2B) or thinner memory modules 200 having a thickness of T=β where β<α (see FIG. 2D). The thicknesses T=α and T=β are merely examples used for illustration.

In examples, the cooling tubes 130 may be made from a semi-rigid material, such that continuing to rotate the cooling tubes 130 beyond $\theta=\theta_{contact}$ may reversibly deform the cooling tubes 130. This deformation may cause a portion of the outer surface of the cooling tube 130 to flatten slightly against the side of the memory module 200, thereby increasing the total surface area of the cooling tube 130 that is in contact with the memory module 200, which may improve heat conduction between the memory module 200 and the cooling tube 130. For example, FIG. 2C illustrates an example in which the cooling tubes 130 have been rotated beyond $\theta_{contact}$, with areas of deformation being indicated by dashed circles. As used herein, "semi-rigid" means any material with a Flexural Modulus that is between 1.3 G·Pa to 15 G·Pa. Because the material of the cooling tubes 130 is semi-rigid in these examples, a relatively small amount of force may cause a noticeable deformation. In contrast, cooling tubes 130 made from a more rigid material (such as copper or other metals) may not deform noticeably in response to the types of forces that can reasonably be applied without damaging the memory modules 200 or the rotation mechanisms of the cooler 100.

The cooling tubes 130 may also be thermally conductive, to facilitate heat transfer from the memory modules 200 through the walls of the cooling tubes 130 into the liquid coolant. As used herein, a material is "thermally conductive" if it has thermal conductivity (often denoted k, λ, or κ) of 1 $W \cdot m^{-1} \cdot K^{-1}$ or greater.

Examples of materials that may be used for the cooling tubes 130 that are both semi-rigid and thermally conductive include TECACOMP® TC compounds and CoolPoly® D-series Thermally Conductive Plastics.

2.2—Example Connectors for the Cooling Tubes

As noted above, the cooling tubes 130 are connected to the first and second manifolds 110, 120 via connectors 140. The connector 140 may be any connector that is capable of: (1) connecting the cooling tube 130 to the manifold 110, 120 in a liquid tight manner such that liquid may be communicated between the manifold 110 and the cooling tube 130 via the connector 140, and (2) allowing a cooling tube 130 that is connected thereto to rotate around its longitudinal axis 133 relative to the manifold 110, 120.

In some examples, the connector 140 may allow the cooling tube 130 to rotate relative to the manifold 110, 120 by allowing the cooling tube 130 to rotate relative to the connector 140. In other words, in such examples, as the cooling tube 130 rotates, the connector 140 may remain fixed relative to the manifold 110, 120, while the cooling tube 130 may move (slip) relative to the connector 140.

In other examples, the connector 140 may allow the cooling tube 130 to rotate relative to the manifold 110, 120 by the connector 140 itself (or a portion thereof) rotating relative to the manifold 110, 120. In other words, in such examples, the cooling tube 130 remains fixed relative to the connector 140, and thus as the connector 140 itself (or a portion thereof) rotates, the cooling tube 130 rotates relative to the manifold 110, 120. For example, the connectors 140 may be rotary connectors, which may also be referred to as rotary unions, rotary joints, rotating unions, rotary swivels, rotary couples, in-line swivel unions, and the like.

FIG. 3A illustrates one example of a connector 140 that is a rotary connector. To avoid duplicative description, the features of the first and second manifolds 110, 120 pertaining to the connector 140 are described together, as the manifolds 110, 120 may include similar features in this respect. Thus, in FIG. 3A reference signs are given for both the first and second manifolds 110, 120, and two reference frames are illustrated for the first and second manifolds 110, 120, respectively. In FIG. 3A, a partial cross-sectional view is shown, in which the manifold 110, 120 and the cooling tube 130 are cut by the cross-section (to allow the connector 140 to be more easily viewed), while the connector 140 is not cut by the cross-section. Cut portions are indicated by hashing.

The example connector 140 illustrated in FIG. 3A includes a first portion 141 connected to a second portion 142 such that the first and second portions 141 and 142 are able to rotate relative to one another. The connector 140 includes a fluid path that allows fluid to flow through the connector 140 between an opening 146 in the first portion 141 and an opening 147 in the second portion 142. The first portion 141 is physically connected to the manifold 110, 120 such that the chamber 116, 126 is communicably connected with the opening 146 in the first portion 141. The second portion 142 is physically connected to the cooling tube 130 such that the hollow portion 136 of the cooling tube is communicably connected with the opening 147 in the second portion 142. Thus, fluid may flow between the chamber 116, 126 and the hollow portion 136 through the connector 140.

The first portion 141 is fixed relative to the manifold 110, 120, for example by threads 143 that engage with sides of the opening 111, 120. The first portion 141 may seal the chamber 116, 126 liquid tight relative to the opening 111, 120. In some examples, a gasket 145 may be included to facilitate sealing. The second portion 142 may be a barb connection and may be fixed relative to the cooling tube 130 by the barbs 144. The barbs 144 of the second portion 142 may seal the hollow interior portion 136 liquid tight relative to the opening at the end of the cooling tube 130. Because the first and second portions 141, 142 can rotate relative to one another and are fixed relative to the manifold 110, 120 and the cooling tube 130, respectively, the connector 140 allows the cooling tube 130 to rotate relative to the manifold 110, 120.

Figure 3B:
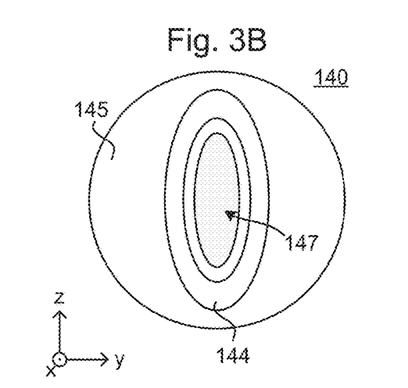
FIG. 3B illustrates an elevation view of an example connector that has oblong barbs.

As noted above, the cooling tubes 130 may have an oblong cross-sectional profile. Accordingly, in some examples, the barbs 144 of the second portion 142 of the connector 140 may also have an oblong cross-sectional profile, so that they may connect with the cooling tubes 130 in a liquid tight manner. For example, FIG. 3B illustrates such an example connector 140 in a plan view facing the surface 145.

Figure 3C:
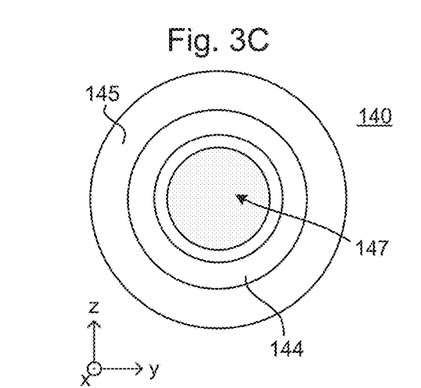
FIG. 3C illustrates an elevation view of another example connector that has circular barbs.

In other examples, the barbs 144 of the second portion 142 of the connector 140 may be circular, as illustrated in FIG. 3C. In examples in which the connector 140 has circular barbs 144, the cooling tubes 130 may have a circular cross-sectional profile at the ends thereof to facilitate connecting to the connector 140, and the cooling tubes 130 may then taper or expand so as to have an oblong cross-sectional profile in a middle portion thereof. In some examples, the cooling tubes 130 may have oblong cross-sectional profiles at least along those portions that face memory modules 200.

Figure 4A:
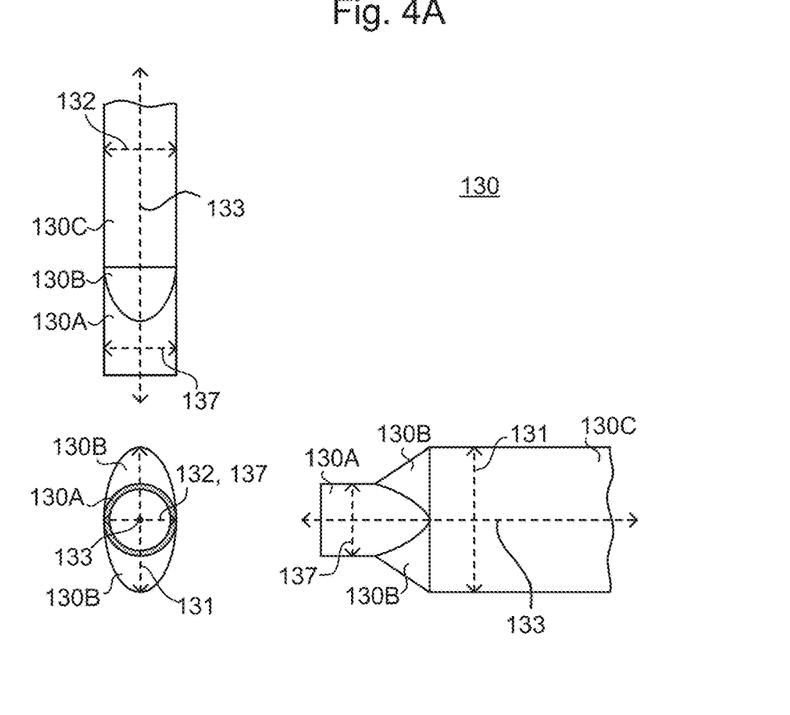
FIG. 4A illustrates a multiview projection of an example cooling tube, with a front elevation view being in the lower left of the Figure, a top plan view being in the top left of the Figure, and a side elevation view being in the lower right of the Figure.
Figure 4B:
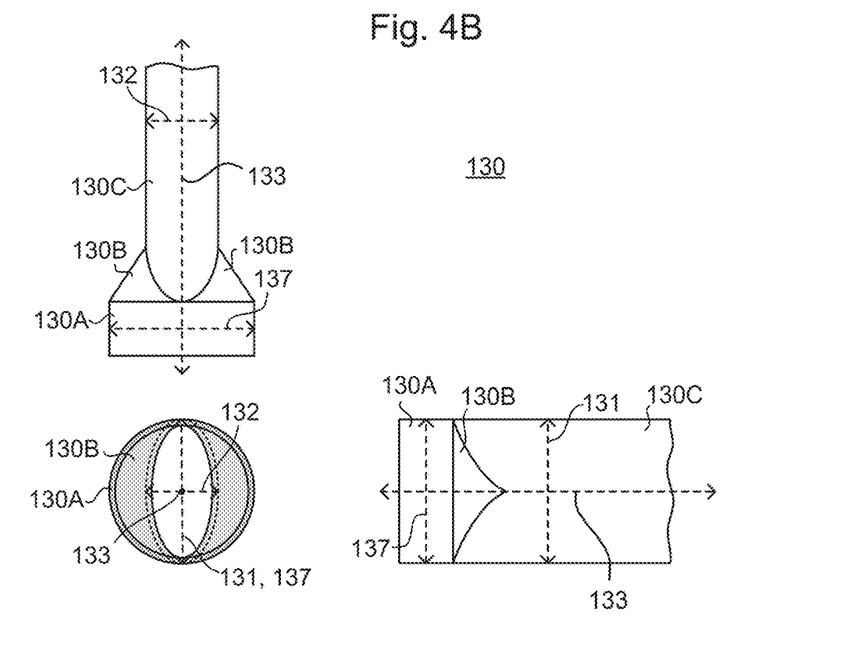
FIG. 4B illustrates a multiview projection of another example cooling tube, with a front elevation view being in the lower left of the Figure, a top plan view being in the top left of the Figure, and a side elevation view being in the lower right of the Figure.

FIGS. 4A and 4B illustrate two possible examples of how the cooling tubes 130 could be circular at the ends and oblong in the middle so as to be able to connect with a connector 140 that has circular barbs 144. FIGS. 4A and 4B each include projection views of example cooling tubes 130, with a front elevation view being in the lower left of each of the Figures, a top plan view being in the top left of each of the Figures, and a side elevation view being in the lower right of each of the Figures. In both FIGS. 4A and 4B the cooling tube 130 has a circular cross-sectional profile at an end region 130A, expands or tapers in an intermediate region 130B, and has an oblong cross-sectional profile in a middle region 130C. In FIG. 4A, the diameter 137 of the cooling tube 130 in the end region 130A is equal to a length of the minor axis 133 of the cooling tube 130 in the middle region 130C, and therefore the cooling tube expands in the intermediate region 130B. In FIG. 4B, the diameter 137 of the cooling tube 130 in the end region 130A is equal to a length of the major axis 131 of the cooling tube 130 in the middle region 130C, and therefore the cooling tube tapers in the intermediate region 130B.

2.3—Example Rotation Mechanism

Figure 5A:
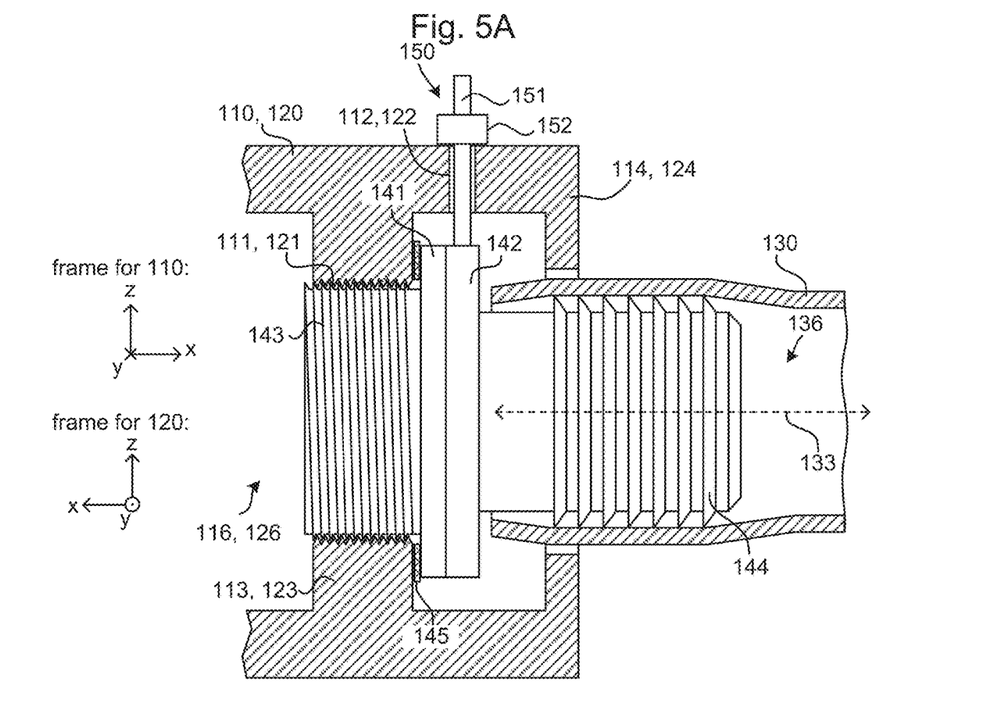
FIG. 5A illustrates a combination of an elevation view and a cross-sectional view of a portion of an example memory module cooler, showing an example rotation mechanism. In the Figure, the example connector and rotation mechanism are shown in elevation view and are not cut by the cross-section, while the example manifold and the example cooling tube are cut by the cross-section. Cut portions are indicated by hashing. The cross-section is taken along the line B-B in FIG. 1, which is approximately aligned with the longitudinal axis of one of the cooling tubes. The elevation view is taken from a perspective on the line C-C.
Figure 5B:
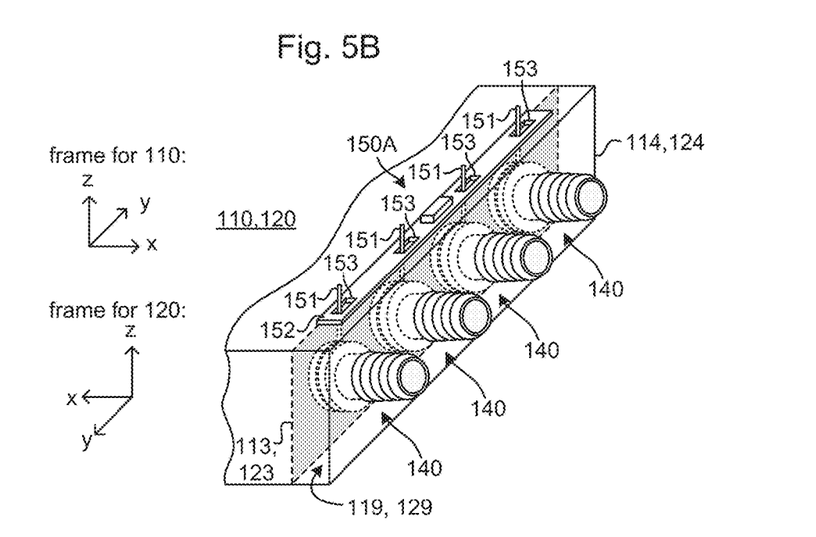
FIG. 5B illustrates a perspective view of a portion of an example memory module cooler, showing the example rotation mechanism of FIG. 5A. Certain portions of the example memory module cooler that would otherwise be obstructed in the view are illustrated in dashed lines.
Figure 6A:
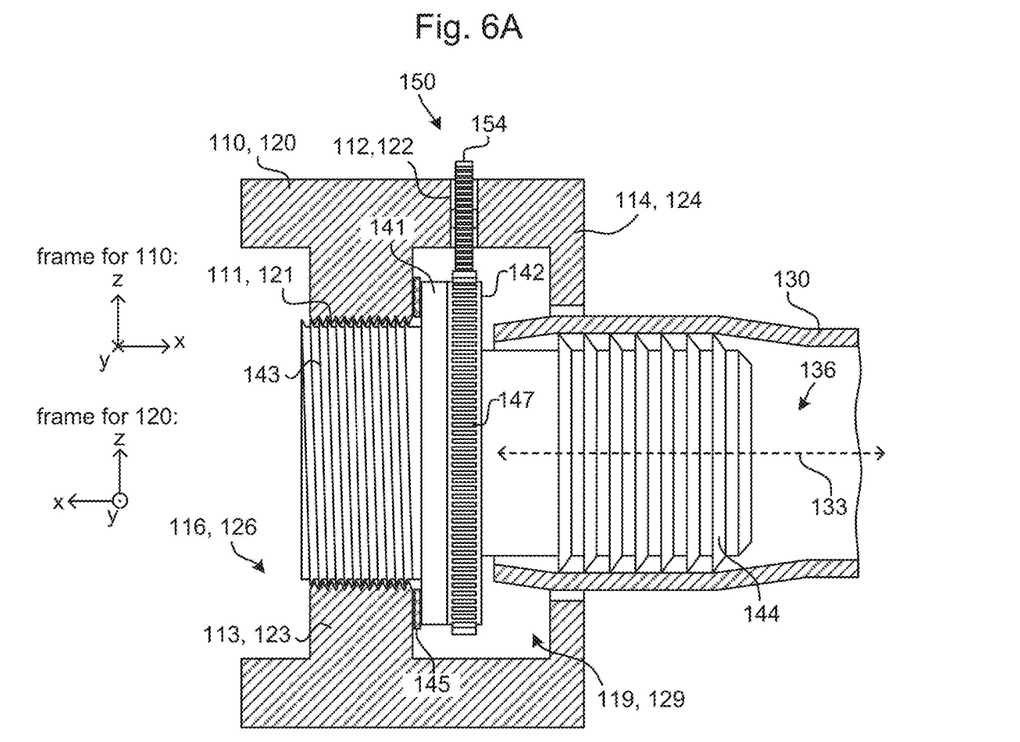
FIG. 6A illustrates a combination of an elevation view and a cross-sectional view of a portion of an example memory module cooler, showing another example rotation mechanism. In the Figure, the example connector and example rotation mechanism are shown in elevation view and are not cut by the cross-section, while the example manifold and the example cooling tube are cut by the cross-section. Cut portions are indicated by hashing. The cross-section is taken along the line B-B in FIG. 1, which is approximately aligned with the longitudinal axis of one of the cooling tubes. The elevation view is taken from a perspective on the line C-C
Figure 6B:
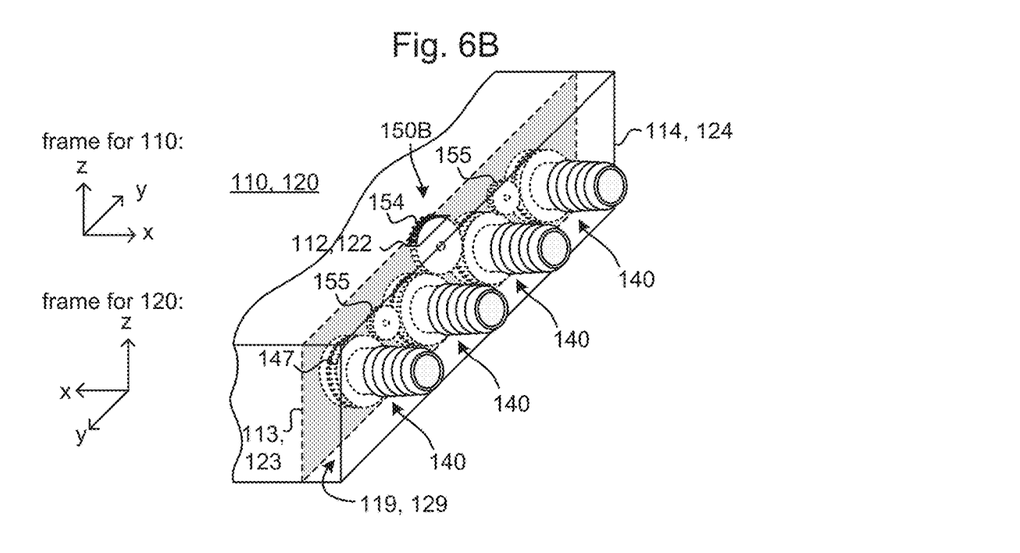
FIG. 6B illustrates a perspective view of a portion of an example memory module cooler, showing the example rotation mechanism of FIG. 6A. Certain portions of the example memory module cooler that would otherwise be obstructed in the view are illustrated in dashed lines.

The cooling tubes 130 may be caused to rotate by any means. For example, FIGS. 5 and 6 illustrate two possible rotation mechanisms 150 that may be used to cause the cooling tubes 130 to rotate. The rotation mechanism 150 may be included in either or both of the manifolds 110, 120. To avoid duplicative description, the features of the first and second manifolds 110, 120 pertaining to the rotation mechanism 150 are described together, as the manifolds 110, 120 may include similar features in this respect. Thus, in FIG. 5A-6B reference signs are given for both the first and second manifolds 110, 120, and two reference frames are illustrated for the first and second manifolds 110, 120, respectively. In FIGS. 5A and 6A, partial cross-sectional views are shown, in which the manifold 110, 120 and the cooling tube 130 are cut by the cross-section, while the connector 140 and portions of the rotation mechanism 150 are not cut by the cross-section. Cut portions are indicated by hatching. In FIGS. 5B and 6B, portions of objects that are within the manifold 110, 120 are shown in dashed lines.

As illustrated in FIGS. 5A and 5B, in a first example of the rotation mechanism 150A, a lever 151 is affixed to the second portion 142 of the connector 140. Thus, when a distal end of the lever 151 is moved, a torque is applied to the second portion 142, causing it (and thus the cooling tube 130 connected to it) to rotate. In some examples, the levers 151 may be connected to one another by a bar 152, such that movement of the bar 152 causes each of the levers 151 to move. For example, in FIG. 5A and 5B the levers 151 extend through holes 153 in the bar 152. In other examples, the levers 151 may be rotably connected to the bar 152. In other examples, the bar 152 may extend through holes in the levers 151.

As illustrated in FIGS. 6A and 6B, in a second example of the rotation mechanism 150B, gears are enmeshed with gear teeth that are included on the respective second portions 142 of the connectors 140. Thus, when the gears are rotated, the connectors 140 with which they are enmeshed are also rotated. In some examples, one of the gears is a main gear 154, which a user may manually cause to rotate, and others of the gears may be transfer gears 155, which each transfer rotation from the main gear 154 and/or a connector 140 to another transfer gear 155 or another connector 140. For example, in FIG. 6B the main gear 154 is enmeshed with two connectors 140, each of these two connectors 140 is enmeshed with a transfer gear 155, and each of these transfer gears 155 is enmeshed with another connector 140. Thus, rotation of the main gear 154 causes all of the connectors 140 to rotate.

In some examples, portions of the rotation mechanisms 150 may be housed within the manifold 110 and/or the manifold 120. For example, in FIGS. 5A-6B, the first portion 141 of the connector 140 is connected to a first wall 113, 123 of the first or second manifold 110, 120, which is an interior wall, and portions of the rotation mechanism 150 may be housed in a chamber 119, 129 that is defined by the first wall 113, 123 and a second wall 114, 124, which is an external wall of the manifold 110, 120. For example, in FIG. 5A-5B, the levers 151 may be connected to the connectors 140 within the chamber 119, 129. In such examples, the levers 151 may extend from within the chamber 119, 129 to an exterior of the manifold 110, 120 through holes 112, 122. As another example, in FIGS. 6A-6B, the gears 154, 155 may be enmeshed with the connectors 140 within the chamber 119, 129. In some examples, the transfer gears 155 may be housed completely within the chamber 119, 129, while the main gear 154 may extend partially outside of the manifold 110, 120 via a hole 112, thereby allowing a user to manually rotate the main gear 154.

In some examples, the rotation mechanisms 150 may include a ratchet (not illustrated) that may allow rotation of the connectors 140 in one direction but prevent rotation in the opposite direction until the ratchet is released. In other examples, a brake may be included that prevents rotation in any direction when engaged and allows rotation in any direction when released. The ratchet or brake may allow firm contact to be maintained between the cooling tubes 130 and the memory modules 200 once they have been rotated into the second configuration. For example, the ratchet or brake may engage one or more of the levers 151, the bar 152, one or more of the gears 154, 155, and/or one or more of the connectors 140 to restrict their motion and/or rotation.

In some examples, no separate ratchet or brake is included. In some such examples, the connectors 140 and/or cooling tubes 130 may be designed to have an inherent resistance to rotation that is sufficiently high to allow the cooling tubes 130 to be held in place after they have been rotated into a desired position. In such examples, the resistance to rotation may be low enough that the cooling tubes 130 may still be rotated by a user when desired.

In some example coolers 100, no special rotation mechanism 150 is provided to cause the cooling tubes 130 to rotate. In such examples, the cooling tubes 130 may be rotated, for example, manually by a user.

3—Example Computing Device

Figure 7:
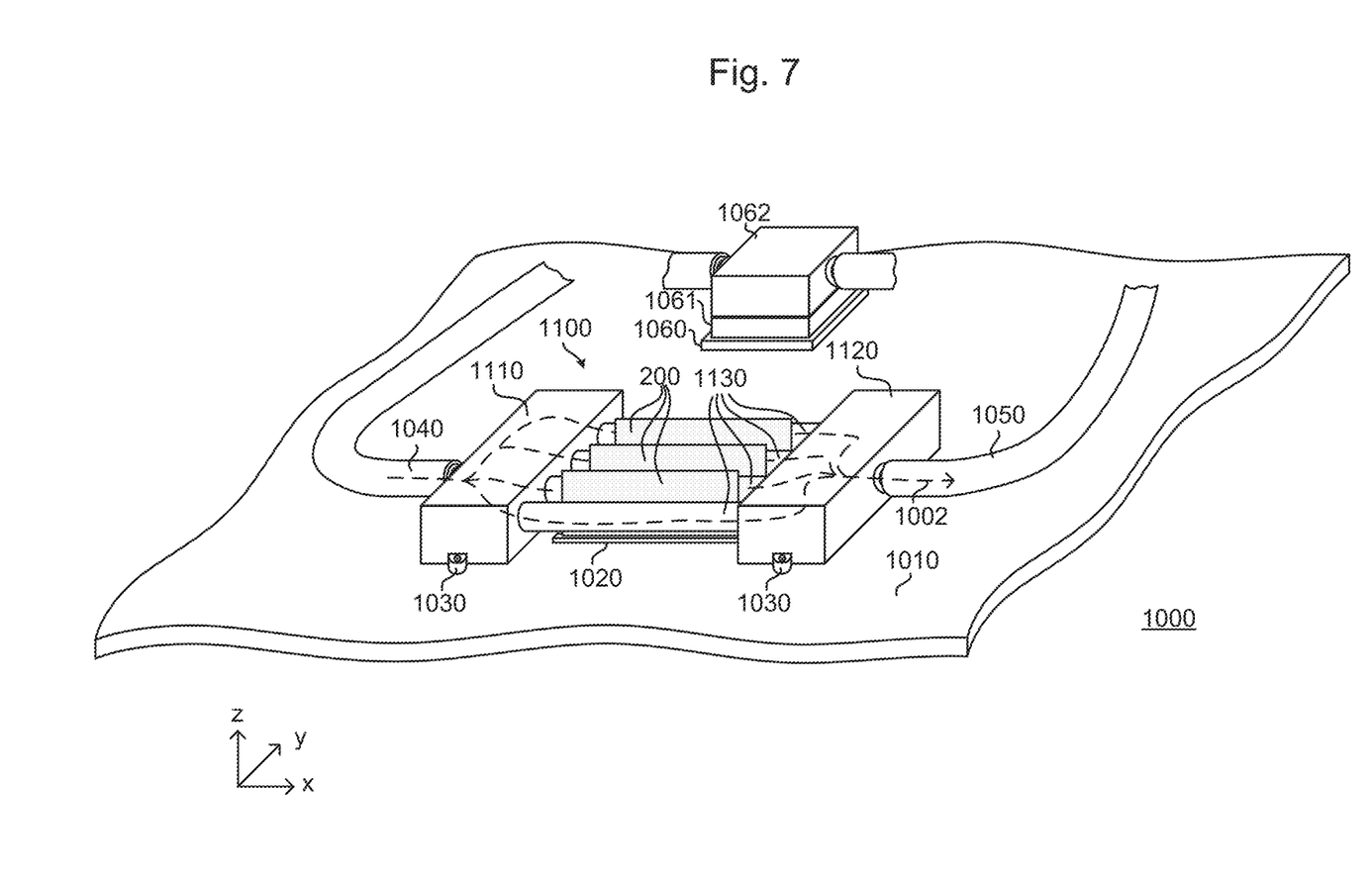
FIG. 7 illustrates a perspective view of an example computing device that includes the example memory module cooler of FIG. 1.

FIG. 7 illustrates an example computing device 1000. The example computing device 1000 includes a main printed circuit board 1010 ("PCB 1010"), memory modules 200 installed in sockets 1020 of the PCB 1010, and a memory module cooler 1100 ("cooler 1100") attached to the PCB 1010 via attachments 1030 (e.g., screws). The cooler 1100 of the computing device 1000 may be any of the example memory module coolers described herein, including but not limited to the example cooler 100.

The cooler 1100 may include a first liquid manifold 1110, a second liquid manifold 1120, a plurality of cooling tubes 1130 connected to the first and second liquid manifolds 1110, 1120. The connections of the cooling tubes 1130 are such that, for each of the plurality of cooling tubes 1130, liquid coolant 1002 can flow from the first liquid manifold 1110 through the respective cooling tube 1130 to the second liquid manifold 1120, and the respective cooling tube 1130 can be rotated relative to the first and second liquid manifolds 1110, 11120 around a longitudinal axis of the respective cooling tube 1130. The cooling tubes 1130 may have an oblong cross-sectional profile. The cooling tubes 1130 may also be thermally conductive. The cooling tubes 1130 may also be semi-rigid.

In some examples, the first and second liquid manifolds 1110, 1120 may be similar to the manifolds 110, 120 described above, and thus duplicative descriptions of these are omitted. In some examples, the cooling tubes 1130 may be similar to the cooling tubes 130 described above, and thus duplicative description of these is omitted. In some examples, connectors (not illustrated) that connect the cooling tubes 1130 to the first and second manifolds 1110, 1120 may be similar to the connectors 140 described above, and thus duplicative description of these is omitted.

In the computing device 1000, the cooler 1100 may be in the installed state that is referred to occasionally above. Specifically, the cooler 1100 may be affixed to the PCB 1010 in a configuration in which the manifolds 1110, 1120 are at opposite ends of the memory modules 200 and the cooling tubes 1130 extend in parallel to the memory modules 200, with each memory module 200 being adjacent to at least one of the cooling tubes 1130. In some examples, each of the memory modules 200 is centered in the y-direction between two adjacent cooling tubes 1130, thereby enabling the two adjacent cooling tube 1130 to simultaneously contact the memory module 200 and maximize heat conduction from the memory module 200 into the cooler 1100.

The computing device 1000 may include a liquid cooling system 1001, which uses liquid coolant 1002 to cool components of the computing device 1000. The liquid cooling system 1001 may include the cooler 1100, as well as a number of tubes, connectors, manifolds, cold plates, reservoir(s), heat exchanger(s), pump(s), and the like (not illustrated), which together may form a closed loop (which may have one or more branches) through which liquid coolant 1002 is caused to flow. The heat exchanger (not illustrated) may be part of the computing device 1000 or separate from the computing device 1000, and may to remove heat from the liquid coolant 1002. The cooler 1100 may be connected into a branch of the liquid cooling system 1001 via an inflow tube 1040 and an outflow tube 1050. Liquid coolant 1002 enters the cooler 1100 via the inflow tube 1040, flows through the cooler 1100, and exits the cooler 1100 via the outflow tube 1050.

When the computing device 1000 is in an operational state, the cooling tubes 130 of the cooler 1100 may be in the second configuration (i.e., they may be in contact with their respective adjacent memory modules 200). If an installed memory module 200 needs to be accessed (such as for servicing, replacement, etc.), the cooling tubes 1130 may be rotated into the first configuration (i.e., the configuration in which they are vertically oriented and/or do not contact the installed memory modules 200), and then the memory module(s) 200 may be accessed (e.g., removed) without needing to disconnect either of the first or second manifolds 1110, 1120 from the PCB 1010. If a new memory module 200 needs to be installed in an open socket 1020 (e.g., to replace a defective memory module 200 or increase capacity), then the memory module 200 may be inserted into the socket 1020 while the cooling tubes 1130 are in the first configuration, and then the cooling tubes 1130 may be rotated into the second configuration to reestablish contact between the cooling tubes 1130 and the memory modules 200.

In some examples, the liquid cooling system 1001 may also cool other components of the computing device 1000 besides the memory modules 200. For example, the computing device 1000 may include a processor 1060, which may be cooled by the liquid cooling system 1001. For example, the processor 1060 may have a heat sink 1061 attached to it, and a cooler 1062 of the liquid cooling system 1001 may be in contact with the heat sink 1061 so as to draw heat therefrom. The cooler 1062 may be connected into a branch of the liquid cooling system via connectors and tubes, and may have liquid coolant 1002 flowing through it to draw away the heat from the heat sink 1061. The computing device 1000 may include additional components that are not illustrated, which may also be cooled by components of the liquid cooling system 1001.

In some examples, the computing device 1000 may include multiple distinct cooling systems (including the liquid cooling system 1001) to cool different components of the computing device 1000.

4—Example Methods

Figure 8:
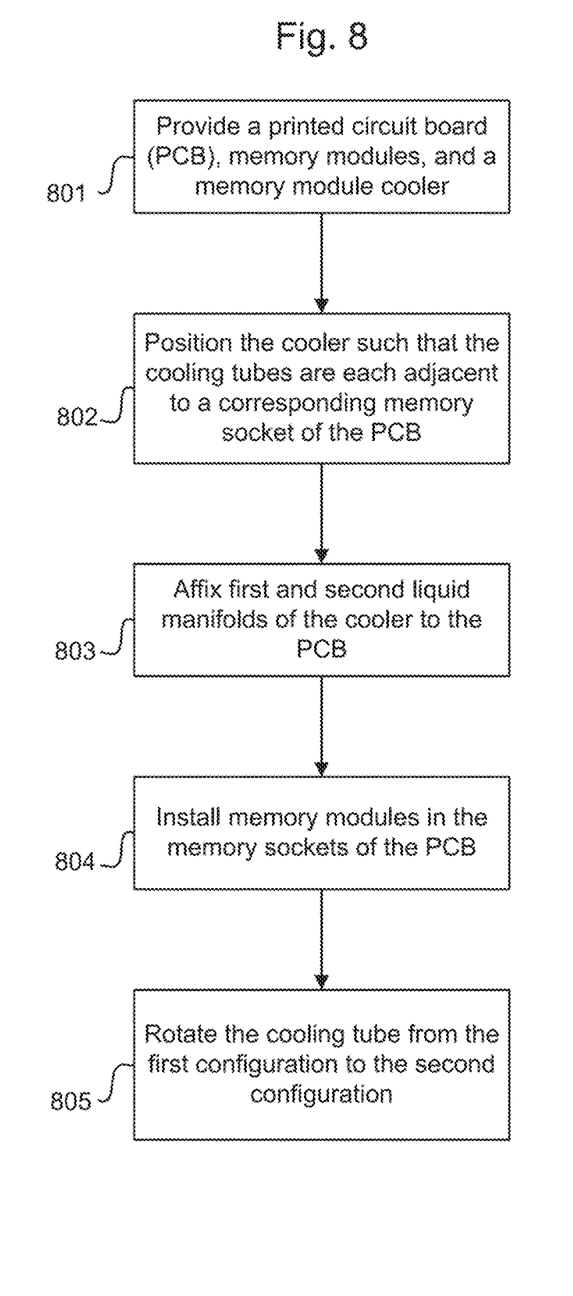
FIG. 8 is a process flow chart illustrating an example process of manufacturing a computing device that includes an example memory module cooler.

FIG. 8 illustrates an example method of manufacturing a computing device (such as the computing device 1000). The method may be performed, for example, at an initial manufacturing/assembly of the computing device. The method may also be performed, for example, after an initial manufacture of the computing device, such as to upgrade and/or refurbish the computing device.

In block 801, a printed circuit board (PCB) is provided, memory modules are provided, and a memory module cooler is provided. The PCB may be a main PCB (e.g., motherboard) of the computing device (such as the PCB 1010), which includes sockets for memory. The PCB may also include a processor and other components of the computing device. The memory module cooler may include a first liquid manifold, a second liquid manifold, and cooling tubes connected to the first and second liquid manifolds such that: liquid coolant can flow from the first liquid manifold through the cooling tubes to the second liquid manifold; and the cooling tubes can be rotated relative to the first and second liquid manifolds around respective longitudinal axes of the cooling tubes between a first configuration and a second configuration. For example, the memory module cooler may be the cooler 100 described above.

After block 801, the method may proceed to blocks 802, 803, and 804. Although illustrated in FIG. 8 as being performed in the order of 802, 803, and then 804, these operations may be performed in other orders. In particular, in some examples, the cooler is installed before the memory modules are installed (or already installed), in which case block 802 may be performed before blocks 803 and block 804 (in such examples, block 803 may be performed either before or after block 804). In other examples, the memory modules are installed before the cooler is installed, in which case block 804 may be performed, then block 802, and then block 803. In other examples, the memory modules are already installed in the provided PCB, in which case block 804 may be omitted.

In block 802, the cooler is positioned such that each of the cooling tubes is adjacent to and extends parallel to at least one corresponding memory socket. In particular, the manifolds may be arranged on opposite ends of the memory sockets of the PCB with the cooling tubes extending between the manifolds. In some examples, block 802 includes positioning the cooler such that each pair of adjacent cooling tubes has a memory socket that is roughly centered in the y-direction between them. In examples in which the memory modules are already installed before the cooler is installed, then in block 802 the positioning of the cooler may include, while the cooling tubes are in a first configuration, inserting some of the cooling tubes between respective pairs of adjacent memory modules.

In block 803, the first and second manifolds of the memory module cooler are affixed to the PCB. In particular, the manifolds may be affixed to the PCB in the position in which they were arranged in block 802. Any method of affixing the manifolds to the PCB may be used—for example, the manifolds may be screwed into the PCB. Block 803 may be performed after block 801, but may be performed either before or after block 804.

In block 804, the memory modules are installed in the memory sockets of the PCB. In examples in which the cooler is installed before the memory modules are installed (i.e., in which block 802 is performed prior to block 804), block 804 may include installing the memory modules in the memory sockets while the cooling tubes are in the first configuration, which for some of the memory modules may entail inserting the memory modules between respective adjacent pairs of cooling tubes.

As noted above, in some examples the memory modules may already be installed in the memory sockets when the PCB is provided, and in such examples block 804 may be omitted. For example, if the process of FIG. 8 is being performed after an initial manufacture of the computing device (e.g., to upgrade the computing device by installing the memory module cooler), the computing device may already have memory modules installed in the memory sockets. In some such examples, the already installed memory modules do not need to be removed in order to install the memory module cooler.

In block 805, the cooling tubes are rotated from the first configuration to the second configuration. More specifically, block 805 may be performed in a state in which the memory module cooler is installed on the PCB (i.e., blocks 803 and 804 are already performed) and memory modules are installed in the memory sockets (i.e., either block 804 is already performed, or block 804 was omitted because memory modules were already installed in the provided PCB). In the first configuration, the cooling tubes are vertically oriented and/or are not in contact with their corresponding adjacent memory module(s), while in the second configuration the cooling tubes are all in contact with their corresponding adjacent memory module(s). Thus, upon completion of block 805, good thermal contact is established between the memory module cooler and the memory modules.

As used herein, a "first configuration" of cooling tubes refers to a class of configurations in which the cooling tubes are either: (1) vertically oriented (i.e., θ=0) or, (2) orientated such that at least some of the cooling tubes do not (or will not) make contact with any of the memory modules when the cooler and memory modules are both installed (i.e., $0 \le |\theta| < \theta_{contact}$)

As used herein, a "second configuration" of cooling tubes refers to a class of configurations in which all of the cooling tubes are making contact with their corresponding adjacent memory module(s).

As used herein, "vertical" refers to a direction that is approximately parallel to the y-axis in the Figures. Thus, as used herein a cooling tube is "vertical" or "vertically oriented" when its major axis is approximately parallel to the y-axis. The y-axis is fixed relative to the cooler, and is such that when the cooler is installed in the computing device the y-axis is roughly parallel to a direction in which memory modules extend outward from the PCB and roughly perpendicular to a surface of the PCB.

As used herein, the terms "substantially" or "roughly" or "approximately" when used in conjunction with an indication of a direction or orientation (e.g., vertical, parallel to, perpendicular to, etc.) means within ±5° of being perfectly aligned with the indicated direction.

As used herein, to "provide" an item means to have possession of and/or control over the item. This may include, for example, forming (or assembling) some or all of the item from its constituent materials and/or, obtaining possession of and/or control over an already-formed item.

Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of active optical devices, wherein the active optical devices . . . " could encompass both one active optical device and multiple active optical devices, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form and subsequent references to the item may include the definite pronoun "the" for grammatical consistency, but this does not necessarily mean that only one item is being referred to. Thus, for example, a phrase such as "an optical socket, wherein the optical socket . . . " could encompass both one optical socket and multiple optical sockets, notwithstanding the use of the singular form and the definite pronoun.

Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Various example processes were described above, with reference to various example flow charts. In the description and in the illustrated flow charts, operations are set forth in a particular order for ease of description. However, it should be understood that some or all of the operations could be performed in different orders than those described and that some or all of the operations could be performed concurrently (i.e., in parallel).

While the above disclosure has been shown and described with reference to the foregoing examples, it should be understood that other forms, details, and implementations may be made without departing from the spirit and scope of this disclosure.

What is claimed is:

1. An apparatus to cool memory modules of a computing device, comprising:
a first liquid manifold;
a second liquid manifold;
a cooling tube connected to the first and second liquid manifolds such that:
liquid coolant can flow from the first liquid manifold through the cooling tube to the second liquid manifold; and
the cooling tube can be rotated relative to the first and second liquid manifolds around a longitudinal axis of the cooling tube,
wherein the cooling tube has an oblong cross-sectional profile and is configured such that, when the apparatus is installed in the computing device, the cooling tube extends between two of the memory modules and is rotatable relative to the first and second liquid manifolds around the longitudinal axis of the cooling tube between a first configuration and a second configuration, and
wherein in the first configuration the cooling tube does not touch the memory modules and in the second configuration the cooling tube touches both of the memory modules.

2. The apparatus of claim 1, wherein the cooling tube is semi-rigid and, when the apparatus is installed in the computing device and the cooling tube is in the second configuration, the cooling tube is deformed by its corresponding memory modules.

3. The apparatus of claim 1,
wherein the cooling tube has a thermal conductivity of at least 1 W/(mK).

4. The apparatus of claim 1, further comprising:
a rotatable connector that connects the cooling tube to the first manifold;
a lever connected to the rotatable connector such that moving the lever causes the cooling tube to rotate about its longitudinal axis.

5. The apparatus of claim 1, further comprising:
rotatable connector that connects the cooling tube to the first manifold;
a gear enmeshed with teeth on the rotatable connector such that rotating the gear causes the cooling tube to rotate about its longitudinal axis.

6. A computing device comprising, comprising:
a plurality of memory modules connected to a printed circuit board;
a first liquid manifold;
a second liquid manifold;

a plurality of cooling tubes connected to the first and second liquid manifolds such that for each of the plurality of cooling tubes:
liquid coolant can flow from the first liquid manifold through the respective cooling tube to the second liquid manifold; and
the respective cooling tube can be rotated relative to the first and second liquid manifolds around a longitudinal axis of the respective cooling tube,
wherein each of the plurality of cooling tubes: is arranged between a corresponding pair of memory modules of the plurality of memory modules, has an oblong cross-sectional profile, and is thermally conductive and semi-rigid, and
for each of the plurality of cooling tubes:
the respective cooling tube is rotatable relative to the first and second liquid manifolds around its longitudinal axis between a first configuration and a second configuration,
in the first configuration the respective cooling tube does not touch its corresponding memory modules and in the second configuration the cooling tube touches both of its corresponding memory modules.

7. The computing device of claim 1, wherein the plurality of cooling tubes are such that, when the plurality of cooling tubes are in the second configuration, each of the plurality of cooling tubes is deformed by its corresponding memory modules.

8. The computing device of claim 6,
wherein each of the plurality of cooling tubes has a thermal conductivity of at least 1 W/(mK).

9. The computing device of claim 6, further comprising:
rotatable connectors that connect the plurality of cooling tubes, respectively, to the first manifold; and
a plurality of levers, each connected to one of the rotatable connectors, and a bar connected to each of the plurality of levers, such that moving the bar causes the plurality of cooling tubes to rotate about their respective longitudinal axis.

10. The computing device of claim 6, further comprising:
rotatable connectors that connect the plurality of cooling tubes, respectively, to the first manifold; and
a plurality of gears, each enmeshed with teeth on at least one of the rotatable connectors such that rotating one of the plurality of gears causes the plurality of cooling tubes to rotate about their respective longitudinal axes.

11. The computing device of claim 6,
wherein the first and second liquid manifolds are affixed to the printed circuit board, and
for each of the plurality of cooling tubes:
the respective cooling tube is rotatable relative to the first and second liquid manifolds around its longitudinal axis between a first configuration and a second configuration,
in the first configuration the respective cooling tubes does not touch its corresponding memory modules and in the second configuration the cooling tube touches both of its corresponding memory modules.

12. A method of servicing the computing device of claim 11, comprising:
rotating the plurality of cooling tubes from the second configuration into the first configuration; and then
removing one of the plurality of memory modules from the printed circuit board without disconnecting either of the first and second liquid manifolds from the printed circuit board and without disconnecting any of the plurality of cooling tubes from either of the first and second liquid manifolds.

13. The method of claim 12, comprising:
with the plurality of cooling tubes in the first configuration, connecting a replacement memory module to the printed circuit board; and then
rotating the plurality of cooling tubes from the first configuration into the second configuration.

14. A method of manufacturing a computing device, comprising:
providing a printed circuit board that includes a number of memory sockets;
providing a memory module cooler that includes a first liquid manifold, a second liquid manifold, and a number of cooling tubes that have oblong cross-sectional profiles and are connected to the first and second liquid manifolds such that:
liquid coolant can flow from the first liquid manifold through the cooling tube to the second liquid manifold; and
the cooling tube can be rotated relative to the first and second liquid manifolds around a longitudinal axis of the cooling tube between a first configuration and a second configuration,
installing the memory module cooler on the printed circuit board by:
positioning the memory module cooler such that each of the cooling tubes is adjacent to and extends substantially parallel to at least one of the memory sockets; and
affixing the first and second liquid manifolds to the printed circuit board; and
in a state in which the memory module cooler has been installed on the printed circuit board and a number of memory modules have been installed in the memory sockets, rotating the cooling tubes from the first configuration, in which the cooling tubes vertically oriented, to the second configuration in which each of the cooling tubes is in contact with one of the memory modules that is adjacent thereto.

15. The method of claim 14,
wherein installing the memory module cooler is performed in a state in which the memory modules have been installed in the memory sockets, and
positioning the memory module cooler such that each of the cooling tubes is adjacent to and extends substantially parallel to at least one of the memory sockets includes, while the cooling tubes are in the first configuration, inserting at least one of the cooling tubes between a pair of adjacent memory modules.

16. The method of claim 14,
wherein installing the memory module cooler is performed in a state in which the memory modules are not yet installed in the memory sockets, and
the method further includes, while the cooling tubes are in the first configuration, installing the memory modules in the memory sockets, including inserting at least one of the memory modules between a pair of adjacent cooling tubes.

17. The method of claim 14,
wherein the cooling tubes and is thermally conductive and semi-rigid.

* * * * *